United States Patent
Ikeda et al.

(10) Patent No.: US 6,596,406 B2
(45) Date of Patent: Jul. 22, 2003

(54) WIRING BOARD PREPREG AND MANUFACTURING METHOD THEREOF

(75) Inventors: Kenichi Ikeda, Ibaraki (JP); Toshiyuki Kawashima, Ibaraki (JP); Nobuharu Tahara, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/029,637

(22) Filed: Dec. 20, 2001

(65) Prior Publication Data

US 2002/0121334 A1 Sep. 5, 2002

(30) Foreign Application Priority Data

Dec. 28, 2000 (JP) ........................................ 2000-400467
Dec. 28, 2000 (JP) ........................................ 2000-400486
Jan. 10, 2001 (JP) ........................................ 2001-002056

(51) Int. Cl.[7] .......................... B32B 5/28; B32B 17/00; B32B 27/00; H05K 3/00
(52) U.S. Cl. ................. 428/474.4; 428/209; 428/304.4; 428/411.1; 428/361; 428/473.5; 29/832; 29/846; 29/852; 427/96; 427/97
(58) Field of Search .......................... 428/474.4, 473.5, 428/209, 304.4, 361, 411.1; 29/846, 852, 832; 427/96, 97; 156/150

(56) References Cited

U.S. PATENT DOCUMENTS

| 5,851,646 A | * | 12/1998 | Takahashi et al. | 174/256 |
| 6,033,765 A | * | 3/2000 | Takahashi et al. | 174/258 |
| 6,121,171 A | * | 9/2000 | Takahashi et al. | 428/308.4 |
| 6,125,531 A | * | 10/2000 | Farquhar et al. | 29/846 |
| 6,197,407 B1 | * | 3/2001 | Andou et al. | 174/255 |
| 6,270,607 B1 | * | 8/2001 | Tachibana | 156/150 |
| 6,323,436 B1 | * | 11/2001 | Hedrick et al. | 174/255 |

FOREIGN PATENT DOCUMENTS

| EP | 1 220 586 A2 | * | 7/2002 |
| JP | 62-279936 | | 12/1987 |
| JP | 9-324060 | | 12/1997 |

\* cited by examiner

*Primary Examiner*—P. Hampton-Hightower
(74) *Attorney, Agent, or Firm*—Knobbe Martens Olson & Bear LLP

(57) ABSTRACT

A wiring board prepreg manufacturing method of the present invention includes the step of depositing and adhering a porous layer made of aromatic polyamide or polyimide onto a heat resistant base material sheet according to a wet gelation process, and the step of impregnating at least one portion of a raw material composition of thermoset resin with insides of pores of the porous layer adhered to the heat resistant base material sheet. Moreover, it is preferable that the step of impregnating the base material composition of the thermoset resin includes the step of applying a raw material liquid of the thermoset resin containing a solvent to a surface of a base material, the step of removing the solvent from the applied raw material liquid so as to obtain a solid coating film, and the step of while heating the solid coating film, laminating and pressurizing the film together with the base material onto the porous layer so as to impregnate at least one portion of the solid coating film.

14 Claims, 3 Drawing Sheets

(a)

(b)

(c)

(d)

(e)

(a)

(b)

(c)

(d)

(e)

(a)

(b)

(c)

(d)

(e)

WIRING BOARD PREPREG AND MANUFACTURING METHOD THEREOF

BACKGROUND OF THE INVENTION

1. Field of the Invention

The present invention relates to a wiring board prepreg manufacturing method including step of impregnating a raw material composition made of thermoset resin with a porous layer formed by a wet gelation process, and a wiring board prepreg which can be obtained by this method, and a using method thereof. Particularly they are useful to manufacturing a double surface wiring board, a multilayer wiring board and the like which requires laser via working.

2. Description of the Related Art

Conventionally, for the step of forming a base material layer, an insulating layer and the like of a wiring board to be used in electronic equipment, a prepreg, in which thermoset resin is impregnated with fiber fabric or polymeric unwoven fabric and is half cured, has been used. Normally the prepreg is laminated with copper foil and used for it. For example, the step of laminating and curing the laminated body on a lower wiring layer or the like by thermally pressing the laminated body, and the step of forming a wiring pattern from the copper foil are repeated, so that a multilayer structure in which wiring layers and insulating layers are stacked successively is formed. Moreover, a laminate where copper foil is laminated on both surfaces of the prepreg by thermal pressing is used for a core substrate of a multilayer wiring board and a double-surface wiring board.

As a method of conductively connecting these wiring layers or metal layers before the wiring pattern is formed, a method of charging electrically conductive paste into a via hole formed in an insulating layer and conductively connecting the metal layers is known. More concretely as shown in FIGS. 3(a) through 3(e), a resin film 13 is further laminated on a prepreg 10 laminated on copper foil 11, and after an opening 5 which reaches the copper foil 11 is formed by the laser via working, electrically conductive paste 6 is charged thereinto by screen printing or the like, and the resin film 13 is peeled so that a surface of the electrically conductive paste 6 has a convex shape, and copper foil 12 is laminated so as to press a convex portion 6a and is thermally pressed so that the copper foil layers are conductively connected. Here, when the resin film is not laminated nor peeled, the convex portion is not formed on the electrically conductive paste, and thus a contacting pressure between the electrically conductive paste and the copper foil is not sufficient, and durability and reliability of the conductive connection between the wiring layers are easily deteriorated.

Meanwhile, besides as a covering layer during the laser via working, due to the reasons that handing property in the wiring board manufacturing method is heightened and adhesion of impurities is prevented, there are a lot of occasions that the prepreg is covered with a resin film. As a method of laminating the resin film on the prepreg, after thermoset resin is impregnated with a reinforcing fiber sheet, the resin film is laminated by a laminator or the like.

However, in the above method of laminating the resin film on the prepreg, it is necessary to prevent interposition of air (air biting) at the time of lamination, and it is necessary to adhere the resin film by a moderate adhesive force in order to peel it in the later step. Therefore, an apparatus, control and the like for the lamination become complicated.

Meanwhile, as a reinforcing phase of the prepreg, there exists an attempt to use a porous film made of polysulfone or the like. In the case where such a porous film is deposited by the wet gelation process (wet phase separating process), there exists a method of applying a polymer solution to a base material sheet and soaking it in a gelation liquid, but the obtained porous film and base material sheet are normally peeled after gelation.

Therefore, it is an object of the present invention to provide a wiring board prepreg with a resin film in which a specified resin film is adhered at the time of forming a porous layer, so that it is not necessary to additionally laminate the resin film and the resin film can be preferably used as a covering material at the time of the laser via working, and a manufacturing method thereof.

In the case where the prepreg is manufactured, when the thermoset resin is impregnated with the porous film or polymeric unwoven fabric, resin is dissolved in a solvent so that varnish is prepared, and after the varnish is applied to and impregnated with the porous film, the solvent is generally vaporized by heating or the like and simultaneously half cured. However, when the varnish is applied directly to the porous film, the porous film is swelled due to the solvent contained in the varnish, or the porous film is deformed due to a stress generated at the time of the application. Particularly in the case where the resin film is laminated, it is found that wrinkles are generated on the surface and an uneven portion is easily generated also on the resin film. As a result, for example after the laser via working, when the electrically conductive paste is applied into the via hole by screen printing, there arises a problem that the screen printing becomes impossible.

Therefore, it is another object of the present invention to provide a wiring board prepreg manufacturing method in which when the thermoset resin is impregnated, an influence of a contained solvent and deformation due to a stress are reduced so that generation of wrinkles or the like can be prevented.

Meanwhile, in the method of further laminating the resin film on the prepreg and peeling it after charging the electrically conductive paste, there arises a problem that a number of steps increases and the cost rises by the resin film.

Therefore, it is another object of the present invention to provide a wiring board prepreg using method where durability and reliability of the conductive connection are maintained satisfactorily and a number of the steps and the costs of raw materials can be reduced.

SUMMARY OF THE INVENTION

When the inventors got a conception that a base material sheet at the time of forming a porous layer is directly utilizing and studied hard about a combination materials which satisfy physical properties required for a prepreg and has excellent adhesion at the time of manufacturing, they found out that the above objects can be achieved by a combination of a porous film made of aromatic polyamide and a polyester film or the like, and finished the present invention.

Namely, a wiring board prepreg manufacturing method of the present invention is characterized by including the steps of: depositing and adhering a porous layer made of aromatic polyamide or polyimide onto a heat resistant base material sheet according to a wet gelation process; and impregnating at least one portion of a raw material composition of thermoset resin with insides of pores of the porous layer adhered to the heat resistant base material sheet.

According to the manufacturing method of the present invention, when the porous layer made of aromatic polyamide or polyimide is formed by the wet gelation process, a polyester film or the like is used as a deposition base material. For this reason, as is clear from the results of the examples, since the porous layer and the polyester film have suitable adhesion property, only the raw material composition of the thermoset resin are impregnated with them so that the prepreg with a resin film can be manufactured. Therefore, it is not necessary to additionally laminate a resin film like in the conventional art, and as mentioned later, the resin film can be preferably used as a coating material at the time of laser via working.

Further, when the inventors studies hard about various methods of applying varnish to the porous film or the like and its substituting method, they found out that the above objects can be achieved by laminating and pressuring a solid coating film, which is obtained by applying the raw material liquid of the thermoset resin to the base material surface and drying it, onto the porous film or the like, and finished the present invention.

Namely, another wiring board prepreg manufacturing method of the present invention is characterized in that the step of impregnating the raw material composition of the thermoset resin includes the step of applying a raw material liquid of the thermoset resin containing a solvent to a surface of a base material, the step of removing the solvent from the applied raw material liquid so as to obtain a solid coating film, and the step of while heating the solid coating film, laminating and pressurizing solid coating film together with the base material onto the porous layer so as to impregnate at least one portion of the solid coating film.

According to this manufacturing method, as is clear from the results of the examples, when the thermoset resin is impregnated, an influence of a contained solvent and deformation due to a stress are reduced so that generation of wrinkles or the like can be prevented.

Further, when the inventors studied hard about a method of conductively connecting metal layers without laminating a resin film for forming a convex portion of an electrically conductive paste, they found out that the above objects can be achieved by forming the thermoset resin layer which is partially exposed on the surface side of the resin porous layer and impregnating the exposed portion and simultaneously consolidating the electrically conductive paste at the time of the conductive connection by means of thermal pressing, and finished the present invention.

Namely, a wiring board prepreg using method of the present invention includes the steps of: using a wiring board prepreg where a half cured (B-stage) thermoset resin is partially impregnated with a porous layer made of aromatic polyamide or polyimide adhered to a heat resistant base material sheet so as to be partially exposed on a surface, peeling the heat resistant base material sheet from the prepreg; and thermally pressing the peeled prepreg which is interposed between metal layers so as to form a laminate whose whole thickness is reduced.

According to the using method of the present invention, the thermoset resin layer is formed so that at least one portion is exposed on the surface side of the resin porous layer, and the laminate as well as the metal layers are thermally pressed so that the whole thickness is reduced, and the electrically conductive paste charged into the opening of the laminate is consolidated. For this reason, even if a resin film for forming a convex portion is not laminated nor peeled unlike the prior art, a sufficient contacting pressure can be obtained between the metal layers and the electrically conductive paste at the time of the conductive connection.

As a result, durability and reliability of the conductive connection can be maintained satisfactorily, and a number of the steps and the costs of base materials can be reduced.

DETAILED DESCRIPTION OF THE PREFERRED EMBODIMENTS

Figure 1:
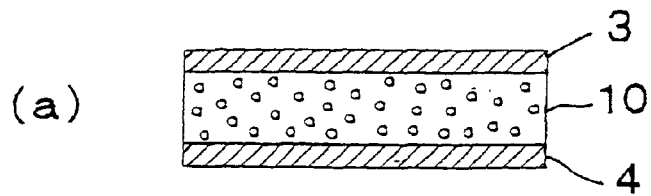
FIGS. 1(a) through 1(e) are step diagrams showing one example using a wiring board prepreg of the present invention.
Figure 1:
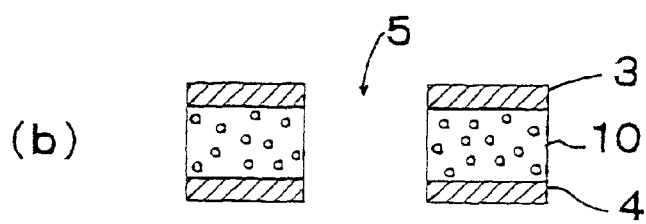
Figure 1:
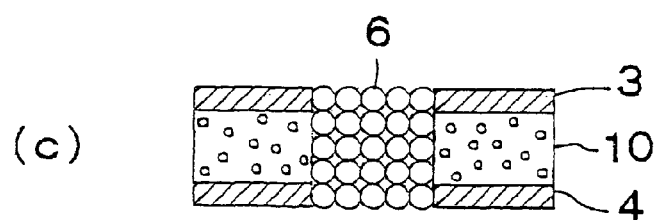
Figure 1:
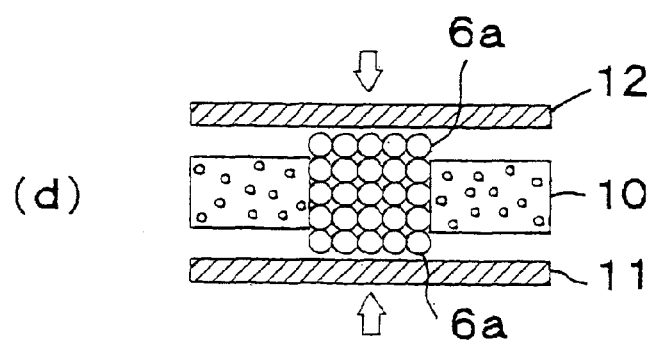
Figure 1:
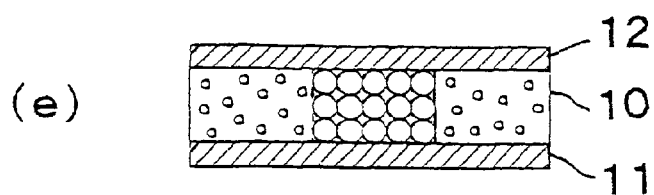

There will be explained below preferred embodiments of the present invention.

A wiring board prepreg manufacturing method of the present invention includes the step of depositing and adhering a porous layer made of aromatic polyamide or polyimide onto a heat resistant base material sheet by means of a wet gelation process.

Examples of the heat resistant base material sheet to be a depositing base material are resin films such as a heat resistant polyester film, a polyamide film and a polyimide film, and metal foil. Particularly, the polyester film or the metal foil is preferable. The polyester film is suitable as a resin film for covering a wiring board prepreg, and the metal foil can be used as an electrically conductive layer for forming a wiring board without peeling it. As a result, a series of the manufacturing steps can be simplified greatly.

As the polyester film, an aliphatic polyester film can be also used, but from the viewpoints of heat resistance and adhesion to aramid, the aromatic polyester film is preferable. Examples of the aromatic films are a polyethylene terephthalate film, a polyethylene naphthalate film, a polybutylene terephthalate film, a poly-1,4-cyclohexane dimethylene terephthalate film, a polyarylate film and a polyester liquid crystal polymer film. Here, as these films, in order to improve the adhesion, films which were subject to surface treatment such as corona discharge treatment may be used.

A thickness of the films may be not less than 5 $\mu$m as long as the films are simply used as the covering material of the prepreg. However, in the case where the film is used to form a convex portion on an electrically conductive paste charged into an opening as mentioned above, the thickness is preferably 2 to 25 $\mu$m, and 8 to 15 $\mu$m is more preferable.

Examples of the metal foil are copper, cupronickel, bronze, brass, aluminum, nickel, iron, stainless, gold, silver, white gold. A thickness of the metal foil is preferably 1 to 50 $\mu$m. It is particularly preferable that copper foil which is suitable as a wiring pattern of the wiring board is used in the present invention. In order to heighten adhesive property to a porous film, the surface of the metal foil may be subject to various physical or chemical surface treatment such as surface roughing treatment and blackening treatment.

In the present invention, the aromatic polyamide whose insulation and heat resistance are satisfactory and hot wire thermal expansion coefficient is low, may be a main component of the porous layer. As the aromatic polyamide, any aromatic polyamide may be used as long as it has aromatic group as main chain, and the following are exemplified concretely.

Examples of the aromatic polyamide are so-called para-type aramid, meta-type aramid, the aromatic polyamide where a part of the skeleton is substituted by diphenyl ether, diphenyl propane, diphenyl methane, diphenyl ketone, diphenyl sulfoxide, biphenyl, and the aromatic polyamide where hydrogen group of aromatic ring is substituted by methyl group, halogen atom or the like.

Examples of the para-type aramid are poly-p-phenylene terephthalamide, but it is necessary that the aramid which is composed only of a rigid component like such polymer is dissolved with special reagent. Therefore, as the aromatic polyamide to be used for the porous film, it is preferable that meta-type aramids or aramids where a part of the skeleton is substituted by a component for giving flexibility is used for at least one part. Examples of the component which gives the flexibility are m-phenylene, 2,7-naphthalene, diphenyl ether, 2,2-diphenyl propane and diphenyl methane. These components are used for copolymerization and are introduced into the skeleton as dicarboxylic acid monomer or diamine monomer. As a copolymerization ratio of the component becomes larger, its solubility to a solvent generally becomes higher.

In addition, blend of two or more kinds of aromatic polyamide such as para-type aramid and meta-type aramid can be used. Further, aliphatic polyamide and another polymer may be partly contained within a range that the heat resistance of the aromatic polyamide and the adhesion to the depositing base material are not deteriorated.

In the membrane formation by the wet gelation process, generally, polymer solution (dope) in which resin and additive are dissolved with a solvent is prepared, and the polymer solution is applied (casting) to the deposition base material and is dipped in a solidifying solution so that a solvent is substituted, and thus the resin is solidified (gelation) and the solidifying solution or the like is dried to be removed so that the porous film is obtained.

From the viewpoint of the solubility, examples of the solvent for dissolving the aromatic polyamide are tetramethyl urea, hexamethyl phosphoramide, N,N-dimethyl acetamide, N-methyl-2-pyrrolidone, N-methyl piperidone-2, N,N-dimethyl ethylene urea, N,N,N',N'-tetramethyl-malonamide, N-methyl caprolactam, N-acetylpyrrolidine, N,N-diethyl acetamide, N-ethyl pyrrolidone-2, N,N-dimethyl propionamide, N,N-dimethyl isobutyl amide, N-methyl formamide, N,N-dimethyl propylene urea, and their mixtures. Further, aprotic polar solvents such as N-methyl-2-pyrrolidone, N,N-dimethyl acetamide and N,N-dimethyl formamide can be preferably used from the viewpoints of the solubility and a speed of solvent substitution with the solidifying solvent. As a particularly preferable example, N-methyl-2-pyrrolidone can be exemplified.

In addition, solvents such as diethylene glycol dimethyl ether, diethylene glycol diethyl ether and diethylene glycol dibutyl ether can be mixed so that the solvent substituting speed can be adjusted.

The dope in the wet gelation process is preferably applied at a temperature range of −20 to 60° C. Moreover, the solidifying solution is not limited as long as it does not dissolve resin to be used and has compatibility with the above solvents. However, water, alcohol such as methanol, ethanol and isopropyl alcohol, and their mixed solutions can be used, particularly water is used preferably. A temperature of the solidifying solution at the time of dipping is not particularly limited, but 0 to 90° C. is preferable.

Concentration of the polymer in the polymer solution preferably falls in a range of 5 weight % to 25 weight %, and 7 weight % to 20 weight % is more preferable. When the concentration is too high, viscosity becomes too high, so that handling is difficult, and when the density is too low, it tends to be difficult to form the porous film.

In order to control a pore structure and a pore diameter, inorganic reagents such as lithium nitrate and organic reagents such as polyvinyl pyrrolidone can be added. As for the concentration of the additives, it is preferable that 1 weight % to 10 weight % of the additives is added to the solution. When the lithium nitrate is added, the substituting speed of the solvent and the solidifying solution become high, so that a finger void structure (structure that there exists a finger-shaped void) can be formed in a sponge structure. When the additives such as polyvinyl pyrrolidone which reduces the solidifying speed are added, the porous film where the sponge structure spreads uniformly can be obtained.

In addition, before the dipping in the solidifying solution, the porous film is left to stand in an atmosphere of not less than 30° C. and relative humidity of not less than 90% for predetermined time (for example, 1 sec. to 10 min.) and moisture or the like is absorbed by the dope, so that the pore diameter of the porous film in the vicinity of the surface may be controlled. With this operation, for example, even in the case of the dope composition that a skin layer is formed on the surface, the pore diameter can be occasionally enlarged to a certain extent.

After the dope is applied to an uniform thickness and is dipped in the solidifying solution such as water so as to be gelated, or the dope is left to stand in an atmosphere of water vapor, to be gelated and then is dipped in water. With these operations, the dope is desolvated so as to become the porous film. After the porous film is formed, it is taken out of the solidifying solution and is dried. The drying temperature is not particularly limited, but the drying at not more than 200° C. is desirable.

On the front and rear surfaces of the porous film, it is preferable that an average pore diameter is not less than 0.05 $\mu$m. 0.1 to 5 $\mu$m is more preferable. Moreover, a size of a pore of the sponge structure (inside) may be 0.05 $\mu$m to 10 $\mu$m, but 1 $\mu$m to 7 $\mu$m is preferable. In the finger void structure, the average pore diameter is preferably 0.05 $\mu$m to 10 u m. As for a void content of the porous film, 30 to 98% is preferable, and 40 to 70% is more preferable.

On the other hand, as the polyimide resin, it may contain another copolymeric component or blend component as long as repeated unit having imide bond between acid residue and amine residue is main body. From the viewpoints of heat resistance, moisture absorption and mechanical strength, polyimide where main chain has aromatic group, or polyimide obtained by polymerizing tetracarboxylic acid component and aromatic diamine component, can be preferably exemplified. Particularly polymer which has limiting viscosity of 0.55 to 3.00, preferably 0.60 to 0.85 (measured value at 30° C.) is desirable. As for the polyimide having the limiting viscosity in the above range, in the case where the porous film is formed by the wet gelation process, the solubility with the solvent is satisfactory and the self-supporting porous film, having a good mechanical strength is obtained.

As the polyimide resin, the polymer or its precursor (polyamic acid) can be used, but since the polyamic acid has higher solubility than polyimide, therefore the polyamic acid has an advantage that constraint in the molecular structure is less. Here, the polymer may be completely imidated, but the polymer whose imidation rate is not less than 70% is satisfactory. In the case where polymer whose imidation rate is comparatively high is used for dope, polymer having a high flexibility component, such as butanetetracarboxylic dianhydride, is preferably used.

The solvent which dissolves the polyimide resin or its precursor is not particularly limited as long as it dissolves them, but aprotic polar solvents such as N-methyl-2-pyrrolidone, N,N-dimethyl acetamide, N,N-dimethyl formamide, dimethylsulfoxide can be used preferably from the viewpoints of the solubility and the speed for solvent substitution with the solidifying solvent in the case where the porous film is formed by the wet gelation process. As more preferable examples, N-methyl-2-pyrrolidone can be exemplified. Moreover, solvents such as diethylene glycol dimethyl ether and diethylene glycol diethyl ether can be mixed, so that the solvent substituting speed in the wet gelation process may be adjusted.

When the porous film of the polyimide resin is formed, in the case where its precursor (polyamic acid) is used, finally it is subject to the heat treatment at 200 to 500° C. so that the precursor is heated and cyclized so as to be a polyimide.

The thickness of the porous layer is not particularly limited, but when the thickness is too thick, desolvation tends to take time, and since a recent multilayer wiring board is thin and light and requires mechanical strength, the thickness is desirably 150 $\mu$m to 2 $\mu$m. 90 $\mu$m to 5 $\mu$m is more preferable.

In the present invention, a heat resistant base material sheet such as a polyester film onto which a porous layer is adhered can be obtained by the above steps, and the present invention includes the step of impregnating a raw material composition of thermoset resin with the inside of the pores of the above-mentioned porous layer.

The raw material composition impregnating method may be a method of applying a raw material liquid of thermoset resin directly onto the surface of the porous layer by means of various coaters or the like. However, it is preferable that this method includes the step of applying the raw material liquid of thermoset resin including a solvent onto the surface of the base material, the step of removing the solvent from the applied raw material liquid so as to obtain a solid coating film, and the step of heating and simultaneously laminating and pressurizing the solid coating film together with the base material onto the porous layer so as to impregnate at least part of the solid coating film.

Examples of the base material are various resin, metal and glass, and it is preferable that the surfaces of those materials are smooth. The shape of the base material may be sheet type, plate type, roll type, belt type and the like. It is preferable that the base material is a resin film for covering the wiring board prepreg as mentioned above. As objects of the covering are a protection layer for heightening the handling property, a protecting layer for laser via working and the like.

The preferred resin films vary with coating objects, but their examples are a polyester film made of polyethylene terephthalate, polyethylene naphthalate or the like, a polyolefin film made of polyethylene, polypropylene or the like, a polyamide film, a polyimide film and the like. Moreover, the coating surfaces of these films may be subject to release treatment or the like so that peeling is easily carried out at the later step.

Examples of the thermoset resin are epoxy resin, phenolic resin, polyimide resin and polyamic acid, but epoxy resin, a mixture of epoxy resin and another resin, and the like are preferable from the viewpoint of the cost and the easy handling. The raw material liquid of the thermoset resin may contain catalyst, hardener, flame retarder, filler, plasticizer, accelerator or the like as well as solvent.

The solvent contained in the raw material liquid of the thermoset resin depends on types of the thermoset resin, but their examples are ketone group, acetate group, ether group, aromatic hydrocarbon group and alcohol group. It is preferable that content of the solvent is 1 to 60 weight % in the raw material liquid from the viewpoint of time required for drying or the like and easy application.

Examples of the applying method are applying methods using a blade coater, a comma coater, a roll coater, a calendar coater and a bar coater. The coating thickness is suitably determined by a relationship with an amount of the solvent to be contained according to a thickness of the solid coating film, mentioned later. As the thickness is more uniform, the thickness of the solid coating film becomes more uniform, and an impregnating amount can be more uniform.

In the present invention, as for the removal of the solvent when the solvent is removed from the applied raw material liquid, a less residue of the solvent is preferable because an influence at the time of the impregnation is reduced. However, it is not necessary to remove the solvent completely, and it may be removed to an extent of non-fluidization. The residue of the solvent is preferably 0.1 to 10 weight % of the solvent contained in the raw material liquid.

As the solvent removing method, a method without heating may be used, but drying by heating and hot-air drying are preferable from the viewpoint of efficiency. As for the heating temperature, a temperature at which curing reaction of the thermoset resin does not proceed overly. For example in the case of the epoxy resin, 50 to 160° C. is preferable. The thickness of the obtained solid coating film depends on void content or the like of a porous layer to be impregnated, but 1 to 100 $\mu$m is preferable.

It is preferable that the present invention includes the step of while heating the solid coating film, simultaneously laminating and pressurizing the solid coating film as well as the base material onto the porous film so as to impregnate at least one portion of the solid coating film. At this time, the whole solid coating film may be impregnated, but when a prepreg is laminated and pressed, its unimpregnated portion can be impregnated. For this reason, only at least one portion of the solid coating film may be impregnated.

The solid coating film can be heated by various heaters. As for the heating temperature, a temperature, at which the solid coating film is softened to an extend of the impregnation and the hardening reaction of the thermoset resin does not proceed overly, is selected. For example, in the case of epoxy resin, 50 to 120° C. is preferable.

Examples of the method of simultaneously laminating and pressurizing with heating are methods using various thermal pressing apparatuses and thermal laminators, and apparatuses where a vacuum exhaust system is added to them, or an apparatus where heating and pressurizing functions are given to the above coating base materials. In the present invention, it is preferable that the impregnation is carried out by a thermal laminator, a vacuum laminator, a vacuum pressing apparatus, or a heat pressing apparatus.

In the present invention, it is preferable that when the softened solid coating film is suitably impregnated with the inside of the pores of the porous layer, the film is pressurizing with a pressure of 0.05 to 5 MPa. When the pressure is too low, the impregnation tends to require long time, and when the pressure is too high, consolidation of the porous film occurs, and thus the desirable impregnation tends to be hardly carried out.

According to this heating and pressurizing, the wiring board prepreg, where half cured thermoset resin was impregnated with the porous layer made of aromatic polyamide or polyimide adhered to the heat resistant base material sheet, can be manufactured. Namely, the wiring board prepreg of the present invention is suitably obtained by the above manufacturing method of the present invention, and at least one portion of the half cured thermoset resin is impregnated with the porous layer made of the aromatic polyamide or polyimide adhered to the heat resistant base material sheet.

As the wiring board prepreg, it is preferable that the solid coating film of the half cured thermoset resin is transferred to the porous layer in the state that a portion thereof is impregnated with the porous layer. Moreover, it is more preferable that the surface of the impregnated resin is coated with a resin film.

There will be explained below the case where the prepreg is subject to laser via working and metal layers are conductively connected as one embodiment of the wiring board prepreg of the present invention. FIGS. 1(a) through 1(e) are step diagrams showing one example of such a conductively connecting method.

Firstly as shown in FIG. 1(a), a resin film 4 is laminated on a surface of the prepreg 10 opposite to a polyester film 3 adhered. As the resin film 4, the polyester film is preferable. As for the lamination, contact bonding by adhesion of the prepreg 10 or simple laminating arrangement may be carried out.

Next, as shown in FIG. 1(b), an opening 5 which pierces through the laminate is formed. Instead of the formation of the opening 5 which pierces through the laminate, not the resin film 4 but a metal layer is provided and an opening 5 along from the surface of the polyester film 3 to the metal layer may be formed. As for the formation of the opening 5, in the case where an opening area is large, drilling, punching or the like according to computer control can be utilized, but normally laser working using various lasers such as YAG laser is carried out. As method, condition and the like of the laser working, conventional methods can be applied. At the time of the laser working, the polyester film 3 also protects the prepreg 10 as its lower layer.

Next, as shown in FIG. 1(c), an electrically conductive paste 6 is charged into the opening 5 so that a surface height becomes substantially equal with a peripheral height. Examples of the electrically conductive paste 6 are those in which particulates of silver, copper, carbon, solder and the like are dispersed in binder resin or solvent. As the binder resin, thermoset resin is suitably used, and its curing reaction proceeds by thermal pressing, mentioned later. It is preferable that an average particle diameter of the particulates is larger than an average pore diameter of the porous layer.

As the charging of the electrically conductive paste 6, methods of printing such as screen printing, offset printing, pad printing, ink-jet printing and bubble-jet printing, and a method of charging with squeeze can be used.

As shown in FIGS. 1(d) and 1(e), the polyester film 3 and the resin film 4 are peeled, and in a state that a convex portion 6a is formed on the electrically conductive paste 6, two metal layers 11 and 12 are laminated and thermally pressed from the up and down directions. By this step, the electrically conductive paste 6 is consolidated, and a contacting force between the electrically conductive paste 6 and both the metal layers 11 and 12 becomes strong.

As materials of the metal layers, various metals such as copper, cupronickel, bronze, brass, aluminum, nickel, iron, stainless, gold, silver and white gold can be used. They may be metal foil or a metal plate, and their thickness is preferably 1 to 50 μm. In the present invention, copper foil which is suitable as a wiring pattern of the wiring board is used particularly preferably. In order to heighten the adhesive property to the prepreg 10, the surface of the metal foil may be subject to various physical or chemical surface treatments such as surface roughing treatment and blackening treatment.

Various pressing apparatuses such as a vacuum pressing apparatus, a thermal pressing apparatus and a continuous pressing apparatus can be utilized, and as for a temperature and a pressure of the thermal pressing, the conventionally well-known conditions can be applied.

The wiring board prepreg is not limited to the case where the above laser via working is carried out, and it can be used also to any applications of the prepreg using a coating film. The using method of the present invention is a wiring board prepreg using method, and this method includes the step of peeling the heat resistant base material sheet from the prepreg using the wiring board prepreg where a half cured thermoset resin is impregnated with the porous layer made of aromatic polyamide or polyimide adhered to the heat resistant base material sheet so as to be partially exposed on the surface, and the step of thermally pressing the prepreg after the peeling via the metal layers so as to form a laminate whose whole thickness is reduced.

At this time, it is preferable that the step of forming the opening which pierces the wiring board prepreg and the step of charging the electrically conductive paste into the opening so that the surface height becomes substantially equal with the peripheral height are executed prior to the step of peeling the heat resistant base material sheet. Moreover, as for the half cured thermoset resin, it is preferable that the solid coating film of the resin is transferred to the porous layer in the state that its portion is impregnated with the porous layer.

There will be explained below the embodiment of the present invention with reference to the diagrams. FIGS. 2(a) through 2(d) are step diagrams showing another example of the prepreg using method of the present invention.

Figure 2:
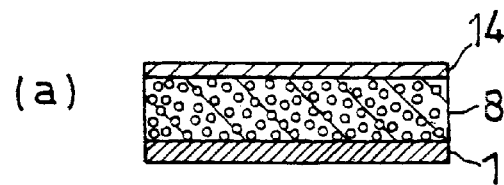
FIGS. 2(a) through 2(e) are step diagrams showing another example using the wiring board prepreg of the present invention.
Figure 2:
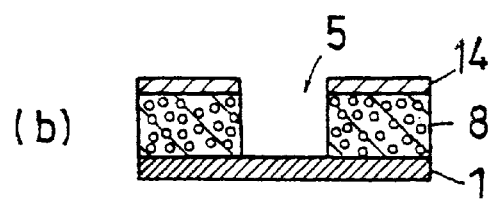
Figure 2:
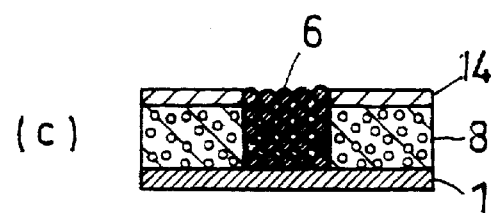
Figure 2:
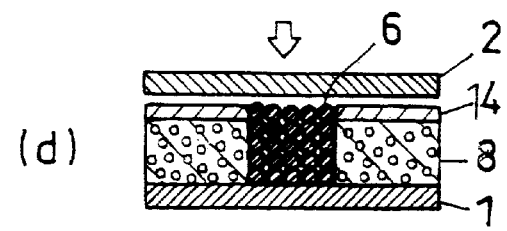
Figure 2:
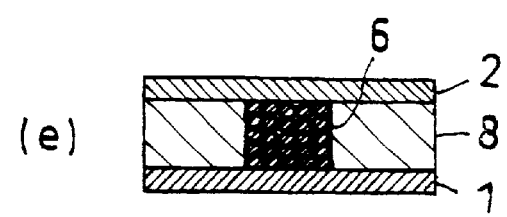
Figure 3:
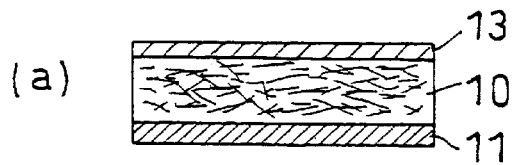
FIGS. 3(a) through 3(e) are step diagrams showing one example of a conventional conductively connecting method of metal layers.
Figure 3:
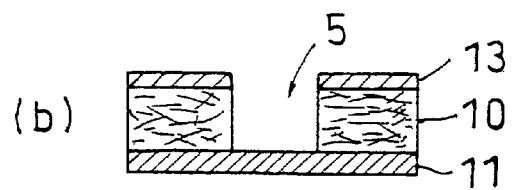
Figure 3:
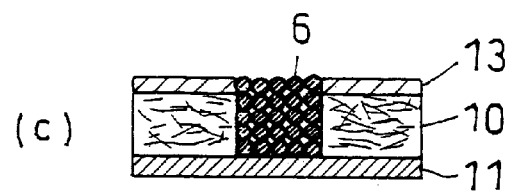
Figure 3:
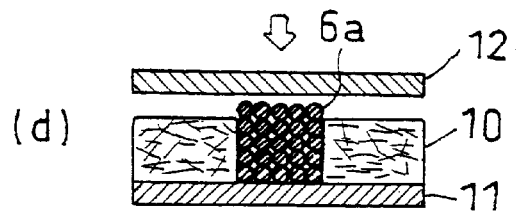
Figure 3:
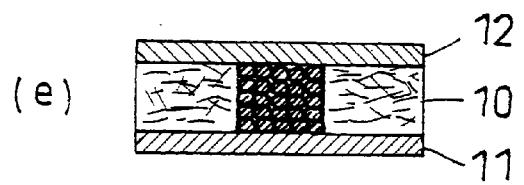

As shown in FIG. 2(a), the present embodiment includes the step of forming a thermoset resin layer 14 so that at least its one portion is exposed on a surface of a resin porous layer 8 laminated on a first metal layer 1. In the present invention, the whole thermoset resin layer 14 may be exposed from the resin porous layer 8 and they are adhered at their interface, and on the contrary, the substantially whole thermoset resin layer 14 may be impregnated with the inside of the resin porous layer 8.

However, in the present invention, the thickness of the exposed portion of the thermoset resin layer 14 depends on the thickness and the void content of the resin porous layer 8, but 0.1 to 100 μm is preferable, and 1 to 20 μm is more preferable. When the thickness of the exposed portion is too small, the contact pressure between the metal layers and the electrically conductive paste and the consolidation of the electrically conductive paste tend to become insufficient, and when the thickness is too large, the exposed portion of the thermoset resin layer 14 is not impregnated so as to tend to remain on the surface.

The step of forming the thermoset resin layer 14 may be a method of applying a raw material liquid of the thermoset resin layer 14 directly onto the surface of the resin porous layer 8 by various coaters, but as mentioned above, the method of transferring the solid coating film, which is obtained by applying the raw material liquid to the surface of the base material and drying it, onto the surface of the resin porous layer 8 is preferable. The thickness of the exposed portion can be adjusted by the thickness of the solid coating film at that time and an impregnating amount at the time of the transfer.

As for the resin porous layer 8 laminated on the first metal layer 1, the porous film which may be formed directly on the metal foil may be used, or after the porous film is formed, the metal foil may be laminated thereon, but from the viewpoint of simplification of the manufacturing steps, the former one is preferably used.

As shown in FIG. 2(b), the present embodiment includes the step of forming the opening 5 along from the surface of the thermoset resin layer 14 to the first metal layer 1. The opening 5 may be such that one portion of the surface of the first metal layer 1 is exposed on the bottom surface of the opening 5, but it is preferable that the whole opening area of the first metal layer 1 is exposed from the viewpoint of reliability and durability of the electrically conductive connection.

As shown in FIG. 2(c), the present embodiment includes the step of charging the electrically conductive paste 6 into the opening 5 so that the surface height becomes substantially equal with the peripheral height. In the present invention, since porous portions exist around the opening 5, when the electrically conductive paste 6 is charged, a problem that air bubbles or the like remain, so that void or the like are generated hardly arises.

As shown in FIGS. 2(d) through 2(e), the present embodiment includes the step of thermally pressing the charged laminate together with the second metal layer 2 so as to reduce the whole thickness. With this step, since the exposed portion of the thermoset resin layer 14 is impregnated with the inside of the resin porous layer 8 (the resin porous layer 8' after impregnation), the electrically conductive paste 6 is consolidated by the height of the exposed portion, and the contact pressure between the electrically conductive paste 6 and both the metal layers 1 and 2 becomes strong.

For the thermal pressing, various pressing apparatuses such as a vacuum pressing apparatus, a thermal pressing apparatus and a continuous pressing apparatus can be used. However, the vacuum pressing apparatus is preferable in order to prevent remaining of air bubbles inside the laminate.

As for the thermal pressing condition, the heating condition such that the thermoset resin layer 14 is sufficiently softened so that the unimpregnated resin porous layer is not consolidated is preferable. For example, in the case of epoxy resin, 20 to 250° C. is preferable, and 100 to 200° C. is more preferable. Moreover, the pressing pressure is preferably 1 to 10 MPa.

EXAMPLE

There will be explained below examples concretely showing the features and effects of the present invention. Here, the average pore diameter and void content of the porous layer were measured in the following manner.
(1) Average Pore Diameter of Porous Layer As for the porous layer, its section was photographed by a scanning electron microscope (SEM), and the average hole diameter was obtained from an image analysis of the photograph by means of a computer.
(2) Void Content of Porous Layer Void content (%) = {1−(weight/density)/volume}×100

The volume and the weight of the porous layer were measured so that the void content was obtained by using the density of the porous layer material according to the above equation.

Example 1-1

A hexane solution of isophthaloyl dichloride and an aqueous solution of m-phenylenediamine were allowed to equimolar-react so that aromatic polyamide was obtained. After this aromatic polyamide (precipitate) was rinsed, cleaned with alcohol and rinsed, it was vacuum-dried at 60° C. overnight so that dry polymer was obtained. This polymer was dissolved in N-methyl-2-pyrrolidone (NMP) at 80° C. and further lithium nitrate was dissolved, and a solution containing 5 weight % of the lithium nitrate and 10 weight % of polymer was obtained as dope.

The solution was applied with a thickness of 30 $\mu$m onto a PEN film (made by Teijin Ltd., Teonex film) with a thickness of 12 $\mu$m and was dipped in a water tank of 40° C. so that the porous layer was formed. Thereafter, the PEN film was stored in water for one day so as to be desolvated. Thereafter, it was dried at 80° C. for 5 hours, and the porous layer which is integrally adhered to and formed on the PEN film was obtained.

The obtained porous layer had a finger void structure with a thickness of 28 $\mu$m that continuous pore was formed in a thicknesswise direction. The average pore diameter was 5 $\mu$m of a short diameter and 25 $\mu$m of a long diameter, and the void content was 78%.

When a raw material composition of thermoset resin which is composed of a solution of 50 weight % of methyl ethyl ketone of bromized bisphenol A epoxy resin was applied to and impregnated with a porous film side of the porous layer, satisfactory impregnating property could be obtained. When the PEN film was tried to be peeled after the heating drying, it could be peeled at the interface easily.

Example 1-2

The aromatic polyamide in the example 1-1 was dissolved in N-methyl-2-pyrrolidone (NMP), and polyvinyl pyrrolidone (PVP) (made by ISP Japan, K-90) and water were further added so that a polymer solution (dope) of aromatic polyamide (100 parts by weight), NMP (900 parts by weight), PVP (40 parts by weight) and water (40 parts by weight) was obtained.

This polymer solution was applied with a thickness of 30 $\mu$m onto the PEN film (made by Teijin Ltd, Teonex film) with a thickness of 12 $\mu$m and was dipped in a water tank of 60° C. so that a porous film was formed. Further, the porous layer was stored in water for one day so as to be desolvated. Thereafter, the porous layer was dried at 80° C. for 5 hours so that the porous layer which was integrally adhered to and formed on the PEN film was obtained. The obtained porous layer had a sponge structure with a thickness of 28 $\mu$m that a continuous pore was formed. The average pore diameter was 0.1 $\mu$m, and the void content was 68%.

When a thermoset resin composition which is composed of a solution of 50 weight % of methyl ethyl ketone of bromized bisphenol A epoxy resin was applied to and impregnated with a porous film side of the porous layer, satisfactory impregnating property could be obtained.

A punch hole of 200 $\mu$m was opened on the prepreg, and electrically conductive paste (50 vol % of solder powder (average particle diameter: about 8 $\mu$m), 50 vol % of solvent) was squeezed to be charged from the PEN side. At this time, when the PEN film was tried to be peeled, it could be peeled easily at the interface. After the peeling, copper foil was pressed and bonded onto both surfaces under the conditions of 60 kg/cm$^2$ and 180° C. so that a double-surface board was prepared, and conductivity of via was confirmed. The via diameter was 160 $\mu$m, a hole of 200 $\mu$m was not spread.

Example 1-3

Except that a PET film (made by Teijin Ltd., tetron film) is used instead of the PEN film of the example 1-2, similarly to the example 1-2, formation of a porous film and its evaluation and via formation were carried out. As a result, a via could be formed into a suitable shape, and conductivity by means of the via was confirmed.

Comparative Example 1-1

Except that polysulfone (made by BP-Amoco, UDEL) was used instead of the aromatic polyamide of the example 1-2, similarly to the example 1-2, a porous layer was formed. However, although the porous film was formed on the PEN film, its adhesion force to the PEN film was not high, and thus the porous layer which is integral with the PEN film could not be obtained. Moreover, the polysulfone porous layer was laminated on the PEN film and was subject to the impregnating treatment similar to the example 1-2, but the polysulfone porous layer was dissolved with methyl ethyl ketone so that a prepreg could not be formed.

Comparative Example 1-2

Except that polyimide, whose monomer components are butanetetracarboxylic acid and diaminodiphenyl ether, was used instead of the aromatic polyamide of the example 1-2, similarly to the example 1-2, a porous layer was formed. However, although a porous film was formed on the PEN film, its adhesion force to the PEN film was not high, and thus the porous layer which is integral with the PEN film could not be obtained.

Comparative Example 1-3

Except that a polypropylene film (made by Toray Industries. Inc., Torayfan) was used instead of the PEN film of the example 1-2, similarly to the example 1-2, a porous film was formed. However, although a porous film was formed on the polypropylene film, adhesion force between the porous layer and the polypropylene film was not high, and thus the porous film which is integral with the polypropylene film could not be obtained.

Preparation Example of Aramid Porous Film

Aromatic polyamide (made by Teijin Ltd., conex) was dissolved in N-methyl-2-pyrrolidone (NMP), and polyvinyl pyrrolidone (PVP) (made by ISP Japan, K-90) and water were further added so that a polymer solution of aromatic polyamide (100 parts by weight), NMP (900 parts by weight), PVP (40 parts by weight) and water (40 parts by weight) was obtained. This polymer solution was applied with a thickness of 30 μm to a PEN film (made by Teijin Ltd., Teonex film), and thereafter immediately it was dipped in a water tank of 60° C. so that a porous film was formed. Thereafter, the porous film was stored in water for one day so as to be desolvated.

The obtained porous film had a sponge structure with a thickness of 30 μm that a continuous pore was formed. The average pore diameter was 0.1 μm, and the void content was 68%.

Preparation Example of Polyimide Porous Film

A solution of 20 weight % of N-methyl-2-pyrrolidone (NMP) of BPDA (biphenyl tetracarboxylic dianhydride)-DDE (diaminodiphenyl ether)-PPD (p-phenylenediamine) polyimide precursor was applied as a polymer solution to a roughed surface of 35 μm rolled copper foil (made by JAPAN ENERGY CORPORATION) by using a film applicator into a uniform thickness with a gap of 100 μm. Immediately after the application, the rolled copper foil was dipped in pure water of 25° C. so that the polyimide precursor was gelated. After the gelation, the rolled copper foil was dried at 90° C. for 1 hour or more. After the drying, the polyimide precursor was subject to heat treatment in an atmosphere of nitrogen at 400° C. for 3 hours, and the polyimide precursor was heated and cyclized so that a polyimide porous film formed on the copper foil was obtained. This film had a sponge structure with a thickness of 30 μm that a continuous pore was formed. The average pore diameter was 0.1 μm and the void content was 50%.

Preparation Example 1 of Adhesive

A thermoset epoxy adhesive 1 having the following composition (resin solid contents: 20 weight %) was prepared.

Epoxy resin: 169 parts by weight
(E1032H60, made by Yuka Shell Epoxy Kabushiki Kaisha)
Phenol resin (Tamanol P-180, made by Arakawa Chemical Industries, Ltd.): 111 parts by weight Methyl ethyl ketone (MEK): 1120 parts by weight Preparation Example 2 of Adhesive A thermoset epoxy adhesive 2 having the following composition (resin solid contents: 40 weight %) was prepared.

Epoxy resin: 338 parts by weight
(E1032H60, made by Yuka Shell Epoxy Kabushiki Kaisha)
Phenol resin (Tamanol P-180, made by Arakawa Chemical Industries, Ltd.): 222 parts by weight
Methyl ethyl ketone (MEK): 840 parts by weight

Example 2-1

The thermoset epoxy adhesive 1 was applied with a thickness of 100 μm directly to the PET film with a thickness of 23 μm as a base material, and the film was dried by a dryer at 80° C. for 15 minutes so that the epoxy adhesive was fixed on the PET film (residual of solvent: 1 weight %). The thickness of the epoxy adhesive layer was about 20 μm. The epoxy adhesive surface of the PET film with the epoxy adhesive was contacted to an aramid surface of the aramid porous film, and they were laminated by a thermal laminator under conditions of 90° C.+0.3 m/min and a pressure of 1 MPa so that a prepreg where the adhesive was impregnated was manufactured.

The whole thickness of the manufactured prepreg (including the film layer of PEN and PET) was 103±5 μm. Moreover, smoothness of the surface of the laminated PET film was satisfactory, namely, was in a state which does not interfere with screen printing.

Example 2-2

The thermoset epoxy adhesive 2 was applied with a thickness of 50 μm directly to the PET film with a thickness of 23 μm as a base material, and the film was dried by a dryer at 80° C. for 15 minutes so that the epoxy adhesive was fixed on the PET film (residual of solvent: 1 weight %). The thickness of the epoxy adhesive layer was about 20 μm. The epoxy adhesive surface of the PET film with the epoxy adhesive was contacted to an aramid surface of the aramid porous film, and they were laminated by a thermal laminator under conditions of 90° C.×0.3 m/min and a pressure of 1 MPa so that a prepreg was manufactured. The whole thickness of the manufactured prepreg (including the film layer of PEN and PET) was 103 ±5 μm. Moreover, smoothness of the surface of the laminated PET film was satisfactory, namely, was in a state which does not interfere with screen printing.

Example 2-3

The thermoset epoxy adhesive 1 was applied with a thickness of 100 μm directly to the PET film with a thickness of 23 μm as a base material, and the film was dried by a dryer at 80° C. for 15 minutes so that the epoxy adhesive was fixed on the PET film. The thickness of the epoxy adhesive layer was about 20 μm. The epoxy adhesive surface of the PET film with the epoxy adhesive was contacted to a surface of the aramid porous film, and they were laminated by a thermal laminator under conditions of 90° C. ×0.3 m/min and a pressure of 1 MPa so that a prepreg where the adhesive was impregnated was manufactured.

The whole thickness of the manufactured prepreg (including lower copper foil and PET) was 108±5 μm. Moreover, smoothness of the surface of the laminated PET film was satisfactory, namely, was in a state which does not interfere with screen printing.

Comparative Example 2-1

The thermoset epoxy adhesive 1 was applied with a thickness of 100 μm directly to the aramid porous film, and the film was dried by a dryer at 80° C. for 15 minutes. Just when the epoxy adhesive was applied, a lot of wrinkles due to swelling were generated on the surface of the aramid. The PET film with a thickness of 23 μm was contacted to the epoxy adhesive applied surface, and they were laminated by a thermal laminator under conditions of 90° C.×0.3 m/min and a pressure of 1 MPa so that a prepreg was manufactured. The whole thickness of the manufacture prepreg (including the film layer of PEN and PET) was 100 to 150 μm. The surface wrinkles of the lower aramid porous film with which epoxy was impregnated were transferred to the laminated PET film, and a lot of wrinkles remain on the surface, and thus the PET film could not be subject to screen printing.

Comparative Example 2-2

The thermoset epoxy adhesive 2 was applied with a thickness of 50 μm directly to the aramid porous film, and the film was dried by a dryer at 80° C. for 15 minutes. Just when the epoxy adhesive was applied, a lot of wrinkles due to swelling were generated on the surface of the aramid. The PET film with a thickness of 23 μm was contacted to the epoxy adhesive applied surface, and they were laminated by a thermal laminator under conditions of 90° C.×0.3 m/min and a pressure of 1 MPa so that a prepreg was manufactured. The whole thickness of the manufacture prepreg (including the film layer of PEN and PET) was 100 to 140 μm. The surface wrinkles of the lower aramid porous film with which epoxy was impregnated were transferred to the laminated PET film, and a lot of wrinkles remain on the surface, and thus the PET film could not be subject to screen printing.

Example 3-1

The thermoset epoxy adhesive 1 was applied with a thickness of 75 μm directly to the PET film with a thickness of 23 μm, and the film was dried by a dryer at 80° C. for 15 minutes so that the epoxy adhesive was fixed on the PET film (residual of solvent: 1 weight %). The thickness of the epoxy adhesive layer was about 15 μm. The epoxy adhesive surface of the PET film with the epoxy adhesive was contacted to an aramid surface of the above aramid porous film, and they were laminated by a thermal laminator under conditions of 90° C.×0.3 m/min and a pressure of 1 MPa so that a porous base material with the adhesive was manufactured. The whole thickness of the manufactured porous base material with the adhesive (including the film layer of PEN and PET) was about 98 μm.

The PEN film of the porous base material with the adhesive was peeled, the peeled surface was contacted with copper foil of 35 μm, and after they were laminated by a thermal laminator under a condition of 100° C.×0.3 m/min, the PET film was peeled. After the PET film was peeled, the epoxy adhesive layer was transferred onto the aramid porous base material. A via hole with a diameter of about 50 μm was opened from the epoxy adhesive layer side by means of YAG laser. After an electrically conductive paste (50 vol % of solder powder (average particle diameter: about 8 μm), 50 vol % of solvent) was charged into the via hole from the epoxy adhesive layer surface by means of screen printing, copper foil of 35 μm was laminated on the epoxy adhesive layer surface, and the laminate was laminated by a thermal laminator under a condition of 50° C. ×0.5 m/min. The whole thickness of a sample after the lamination was about 115 μm. This sample was thermally pressed by a vacuum pressing machine under conditions of a chamber inner pressure of 3 torr, a heating temperature of 180° C. and a pressing pressure of 20 kg/cm$^2$ so that a double-surface copper foil board was manufactured. The whole thickness of the manufactured double-surface copper foil board was decreased to about 100 μm.

Example 3-2

The PEN film of the above aramid porous base material was peeled, and the peeled surface was contacted to copper foil of 35 μm, and they were laminated by a thermal laminator under a condition of 80° C.×0.3 m/min. The thermoset epoxy adhesive 1 was applied with a thickness of 75 μm onto the aramid porous film laminated on the copper foil and was dried by a dryer at 80° C. for 15 minutes. The whole thickness of the dried sample was about 75 μm because a part of the epoxy adhesive was impregnated with the aramid porous base material. A via hole with a diameter of about 50 μm was opened from the epoxy adhesive applied surface by means of YAG laser. After an electrically conductive paste (50 vol % of solder powder, 50 vol % of solvent) was charged into the via hole from the epoxy adhesive layer surface by means of screen printing, copper foil of 35 μm was laminated on the epoxy adhesive layer surface, and they were laminated by a thermal laminator under a condition of 50° C.×0.5 m/min. The whole thickness of the laminated sample was about 110 μm. This sample was thermally pressed by a vacuum pressing machine under conditions of a chamber inner pressure of 3 torr, a heating temperature of 180° C. and a pressing pressure of 20 kg/cm$^2$ so that a double-surface copper foil board was manufactured. The whole thickness of the manufactured double-surface copper board was reduced to about 100 μm.

Comparative Example 3-1

The thermoset epoxy adhesive 1 was applied with a thickness of 75 μm directly to copper foil of 35 μm, and it was dried by a dryer at 80° C. for 15 minutes. The dried whole thickness was about 50 μm. Polyimide film Kapton 100H (made by DuPont-Toray Co., Ltd) with a thickness of 25 μm was contacted to the epoxy adhesive, and they were laminated by a heat laminator under a condition of 50° C.×0.5 m/min. The thermoset epoxy adhesive 1 was applied with a thickness of 75 μm directly to the polyimide film surface, and they were dried by a dryer at 80° C. for 15 minutes. The whole thickness at this time was about 90 μm. A via hole with a diameter of about 50 μm was opened from the epoxy adhesive applied surface by means of YAG laser. After an electrically conductive paste (50 vol % of solder powder, 50 vol % of solvent) was charged into the via hole from the epoxy adhesive layer surface by means of screen printing, copper foil of 35 μm was laminated on the epoxy adhesive layer surface, and they were laminated by a thermal laminator under a condition of 50° C.×0.5 m/min. The whole thickness of the laminated sample was about 125 μm. This sample was thermally pressed by a vacuum pressing machine under conditions of a chamber inner pressure of 3 torr, a heating temperature of 180° C. and a pressing pressure of 20 kg/cm² so that a double-surface copper foil board was manufactured. The whole thickness of the manufactured double-surface copper board was seldom changed in comparison with the whole thickness before the thermal pressing.

Test Example

In order to compare connection reliability of the double-surface copper boards manufactured in the examples 3-1 and 3-2 and comparative example 3-1, thermal shock test was conducted under the following conditions. Namely, the test under conditions of −65°C.×30 min. and 125° C.×30 min. was repeated in 1000 cycles, and resistance values before and after that were measured. The results are shown in Table 1.

TABLE 1

| A number of cycles | Example 3-1 | Example 3-2 | Comparative example 3-1 |
| --- | --- | --- | --- |
| 0 cycle | 900 to 940 m Ω | 890 to 950 m Ω | 910 to 950 m Ω |
| 1000 cycles | 910 to 960 m Ω | 890 to 960 m Ω | 1120 to 1300 m Ω |

As is clear from the results of Table 1, according to the example of the present invention, the resistance values due to the thermal shock test are seldom lowered, and thus the durability and reliability of the electrically conductive connection become satisfactory. On the contrary, in the comparative example 3-1 where the electrically conductive paste is not pressure-contacted to the metal layer, the resistance values due to the thermal shock test are changed, and thus the durability and reliability of the electrically conducive connection are deteriorated.

What is claimed is:

1. A wiring board prepreg manufacturing method comprising the steps of:

forming a liquid layer containing aromatic polyamide or polyimide on a heat resistant base material sheet made of a resin to provide an initial sheet;

subjecting said initial sheet to a wet gelation process to transform said liquid layer to a porous layer adhered to said base material sheet; and impregnating a thermosetting resin composition into said porous layer adhered to said base material sheet.

2. The wiring board prepreg manufacturing method according to claim 1, wherein said step of impregnating the thermosetting resin composition comprises (i) applying a liquid thermosetting resin composition containing a solvent to a surface of another base material, (ii) removing the solvent from the applied liquid composition so as to obtain a solid coating film, and (iii) while heating the solid coating film, laminating and pressurizing the solid coating film together with said other base material onto the porous layer so as to impregnate at least one portion of the solid coating film into said porous layer.

3. The wiring board prepreg manufacturing method according to claim 2, wherein said other base material is a resin film for covering the wiring board prepreg, and said impregnation is performed by a thermal laminator, a vacuum laminator, a vacuum pressing apparatus or a thermal pressing apparatus.

4. The wiring board prepreg manufacturing method according to claim 1, wherein said heat resistant base material sheet is a polyethylene terephthalate film or a polyethylene naphthalate film.

5. A wiring board prepreg, wherein at least one portion of a half-cured thermosetting resin is impregnated into a porous layer made of aromatic polyamide or polyimide adhered to a heat resistant base material sheet, and the porous layer has an average surface-pore size of 0.05 μm or more and a sponge structure or a finger void structure with an average inside-pore size of 0.05 to 10 μm.

6. The wiring board prepreg according to claim 5, wherein said half-cured thermosetting resin is a solid coating film transferred to the porous layer in the state that its portion is impregnated into the porous layer.

7. The wiring board prepreg according to claim 5, wherein said heat resistant base material sheet is a polyethylene terephthalate film or a polyethylene naphthalate film.

8. The wiring board prepreg according to claim 5, wherein a surface of the impregnated thermoset resin is covered with a resin film.

9. A wiring board prepreg using method comprising the steps of:

providing a wiring board prepreg where a half-cured thermosetting resin is partially impregnated into a porous layer made of aromatic polyamide or polyimide adhered to a heat resistant base material sheet so as to be partially exposed on a surface, wherein the porous layer has an average surface-pore size of 0.05 μm or more and a sponge structure or a finger void structure with an average inside-pore size of 0.05 to 10 μm;

peeling the heat resistant base material sheet from the prepreg; and thermally pressing the peeled prepreg which is interposed between metal layers so as to form a laminate whose whole thickness is reduced.

10. The wiring board prepreg using method according to claim 9, wherein the step of previously forming a through opening on the wiring board prepreg, and the step of charging an electrically conductive paste into the opening so that a surface height becomes substantially equal with a peripheral height are executed prior to the step of peeling the heat resistant base material sheet.

11. The wiring board prepreg using method according to claim 9, wherein said half cured thermoset resin is a solid coating film transferred to the porous layer in the state that its portion is impregnated with the porous layer.

12. A wiring board prepreg manufacturing method comprising the steps of:

applying a liquid thermosetting resin composition containing a solvent to a surface of a base material;

removing the solvent from the applied liquid composition to obtain a solid coating film, and laminating, pressurizing, and heating, concurrently, the coating film formed on the base material onto a porous layer to form a prepreg, wherein at least a portion of the solid coating film is impregnated into the porous layer.

13. The wiring board prepreg according to claim 5, wherein the porous layer has an average surface-pore size of 5 μm or less.

14. The wiring board prepreg using method according to claim 9, wherein the porous layer has an average surface-pore size of 5 μm or less.

* * * * *